(12) United States Patent
Wallis

(10) Patent No.: US 7,928,722 B2
(45) Date of Patent: Apr. 19, 2011

(54) APPARATUS AND METHOD FOR VOLTAGE SENSING IN ELECTRICAL METERING SYSTEMS

(75) Inventor: Lee D. Wallis, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 122 days.

(21) Appl. No.: 12/389,623

(22) Filed: Feb. 20, 2009

(65) Prior Publication Data
US 2010/0213926 A1 Aug. 26, 2010

(51) Int. Cl.
*G01R 1/30* (2006.01)
(52) U.S. Cl. .................................. 324/124; 324/127
(58) Field of Classification Search .................... None
See application file for complete search history.

(56) References Cited

U.S. PATENT DOCUMENTS

| | | | |
|---|---|---|---|
| 3,775,683 A * | 11/1973 | Barta et al. | 324/142 |
| 4,054,829 A * | 10/1977 | Searle | 323/356 |
| 4,970,459 A * | 11/1990 | Germer et al. | 324/142 |
| 5,053,697 A | 10/1991 | Carnel et al. | |
| 5,391,983 A | 2/1995 | Lusignan et al. | |
| 5,548,209 A | 8/1996 | Lusignan et al. | |
| 5,563,506 A | 10/1996 | Fielden et al. | |
| 5,834,932 A | 11/1998 | May | |
| 6,674,278 B1 * | 1/2004 | Uesugi | 324/127 |
| 7,075,288 B2 | 7/2006 | Martin et al. | |

FOREIGN PATENT DOCUMENTS

WO    WO 2007/056140 A2    5/2007

* cited by examiner

*Primary Examiner* — Minh N Tang

(57) ABSTRACT

A voltage isolation circuit. The input voltage Vin is connected to a primary winding of a transformer T1 through a current limiting resistor R1. R1 is preferably sized such that the current flow in the primary at nominal input voltage is approximately 1 milliamp. Transformer T1 is wound as a current transformer with a fixed ratio between the primary and secondary windings. Thus, when 1 mA flows in the primary winding, 1 mA will also flow in the secondary winding. An inverting operational amplifier will continuously attempt to drive its inverting input to a zero potential through resistor R2. The voltage at Vout produced by the op-amp is a faithful replica of the voltage at Vin, but scaled according to the values selected for R1 and R2.

12 Claims, 3 Drawing Sheets

APPARATUS AND METHOD FOR VOLTAGE SENSING IN ELECTRICAL METERING SYSTEMS

FIELD OF THE INVENTION

Aspects disclosed herein relate generally to electrical metering systems, and, more particularly, to an apparatus and method for voltage sensing in electrical metering systems.

BACKGROUND

Historically, electricity has been metered by using electromechanical meters and more recently solid-state meters. In those instances where it is necessary to meter electricity at a voltage higher than 120V, instrument transformers are used to step down the voltage to the nominal input voltage of the meter, usually 120V. Because these instrument transformers are required to provide enough energy to drive the mechanism of the meter while still maintaining a precise voltage ratio, they are quite large, heavy, and expensive.

Traditionally, a potential transformer (PT) can be used for voltage sensing, but PTs are very large and heavy. To maintain accuracy and to negate ratio errors due to loading, PTs are typically oversized so that they reproduce voltage faithfully across the loading range. For example, for a 1 volt-ampere (VA) loading, a PT rated at 25 VA is typically used and can weigh several pounds. Galvanic isolation provided by transformers is important to maintain in metering applications to isolate circuits coupled to the secondary side from circuits coupled to the primary side, where high levels of voltage are present. Metering voltage by providing only a voltage divider circuit directly from the line would not provide the requisite galvanic isolation.

What is needed, therefore, is a compact voltage sensing solution. The present disclosure is directed to addressing these and other needs.

BRIEF SUMMARY

The device presented herein provides a solution that is much smaller and less expensive in those instances where no appreciable burden is present in the connected meter input voltage channel(s). This is more and more the case as manufacturers move toward solid-state metering; in many instances the burden of a single voltage channel is less than 0.1 VA. This device can also be combined with a conventional control power transformer for powering an attached meter. Because the control power transformer does not have to be precision wound and oversized to maintain accuracy it can be much smaller. The voltage sensing transformer operates in current mode, at very low current levels, so it does not have to be large and bulky as conventional potential transformers do. This invention can be used to provide voltage input conditioning for any electronic metering or protection device at a significant cost and space saving over existing technology. Applications include meters, monitors, trip units, protective relays and control products.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
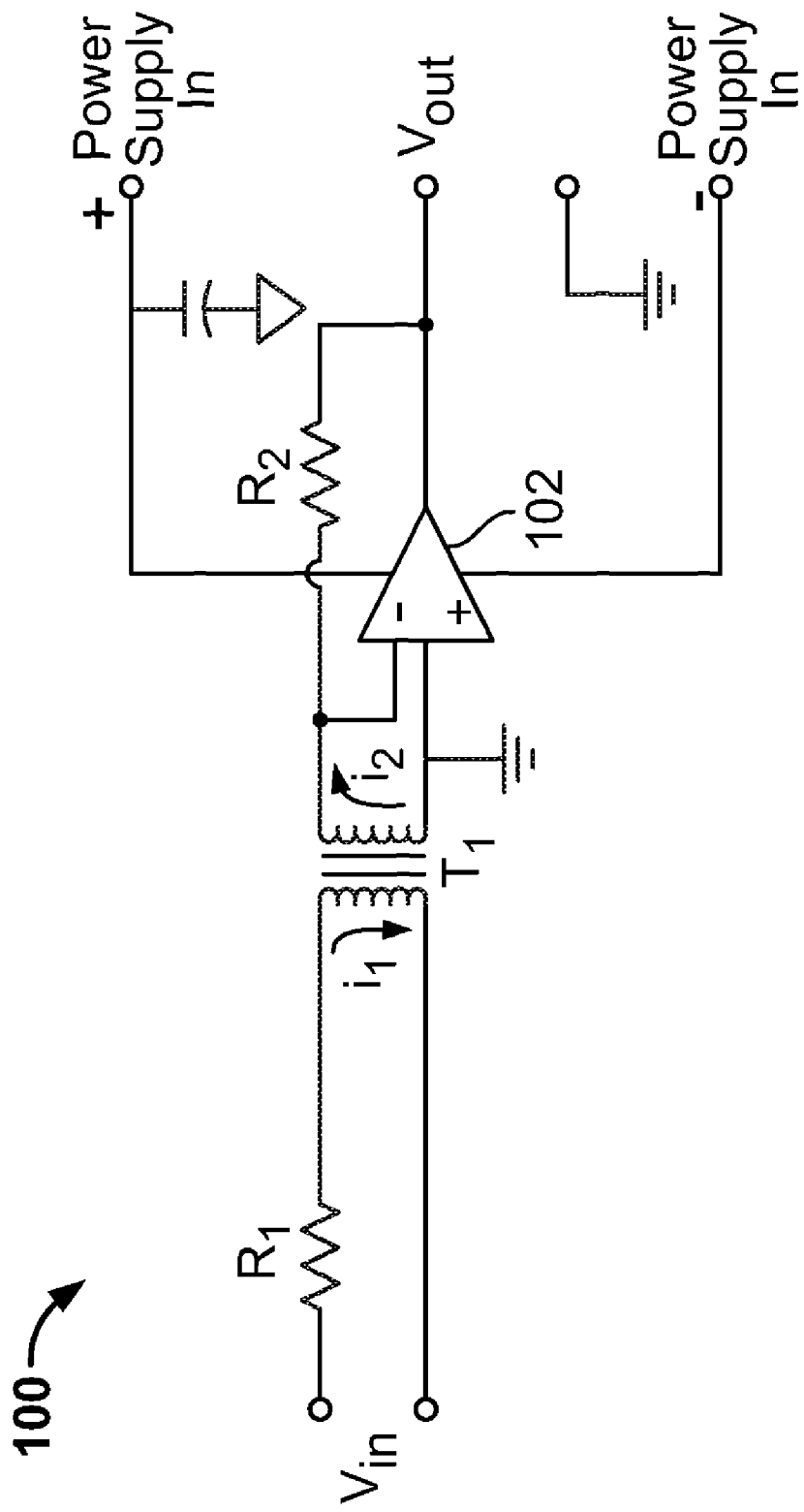
FIG. 1 is a functional block diagram of a voltage isolation circuit.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Devices such as Intelligent Electronic Devices ("IEDs") and more specifically electric meters typically are connected to transformers such as current transformers or potential transformers. Often due to space and installation size restrictions the IEDs are separate from the current transformers. IEDs include protection relays, fault recorders, electrical meters, and other devices used to manage, measure and control the distribution of electric power. Electrical meters include revenue meters of the type used by energy suppliers to accurately measure electrical energy delivered to consumers on an electrical grid for the purposes of billing and/or collecting revenue, and power quality meters having power quality monitoring, detection and reporting capabilities.

Turning now to FIG. 1, a functional block diagram of a voltage isolation circuit 100 (VIC) is shown. The input voltage (Vin) is connected to a primary winding of a transformer T1 through a current limiting resistor R1. Vin is typically 120V sinusoidal (Vac), but can be as high as 480V or 600V. The resistor R1 is preferably sized such that the current flow in the primary at nominal input voltage is approximately 1 milliamp. A transformer T1 is wound as a current transformer with a fixed (e.g., one-to-one) ratio between the primary and secondary windings. The number of turns is not pertinent to the present invention, but can be as few as 25 or fewer or 1500 or more on both windings or any range in between. The transformer T1 provides galvanic isolation between circuits coupled to the primary and secondary windings, respectively. Thus, when 1 mA of primary current, i1, flows in the primary winding, 1 mA will also flow in the secondary winding, ignoring relatively small transformer core losses and resistance losses in the windings. The inverting operational amplifier ("op-amp") 102 will continuously attempt to drive its inverting input to a zero potential through resistor R2, effectively shorting out the secondary winding of the transformer T1 such that the current has to flow through R2, which cancels out the current i2 flowing through the secondary winding. To the circuit on the primary side of the transformer T1, the circuit on the secondary side of the transformer T1 appears to be a simple resistive circuit. The voltage at Vout produced by the op-amp 102 is a faithful replica of the voltage at Vin, but scaled according to the values selected for R1 and R2. Vout is galvanically isolated from Vin by reason of the transformer T1 to provide isolation.

The selection of the value for R1 depends upon the amount of current, i1, desired to flow through the primary winding of the transformer T1. R1 is sized to induce current to flow in the op-amp circuit. In an example where i1 is desired to be 1 mA at Vin=120V, R1=120 kΩ. The selection of the value for R2 depends upon the desired Vout. R2 is sized according to how much voltage swing is desired at Vout. In an example where Vout is desired to be 100 mV, R2=100Ω.

Figure 2:
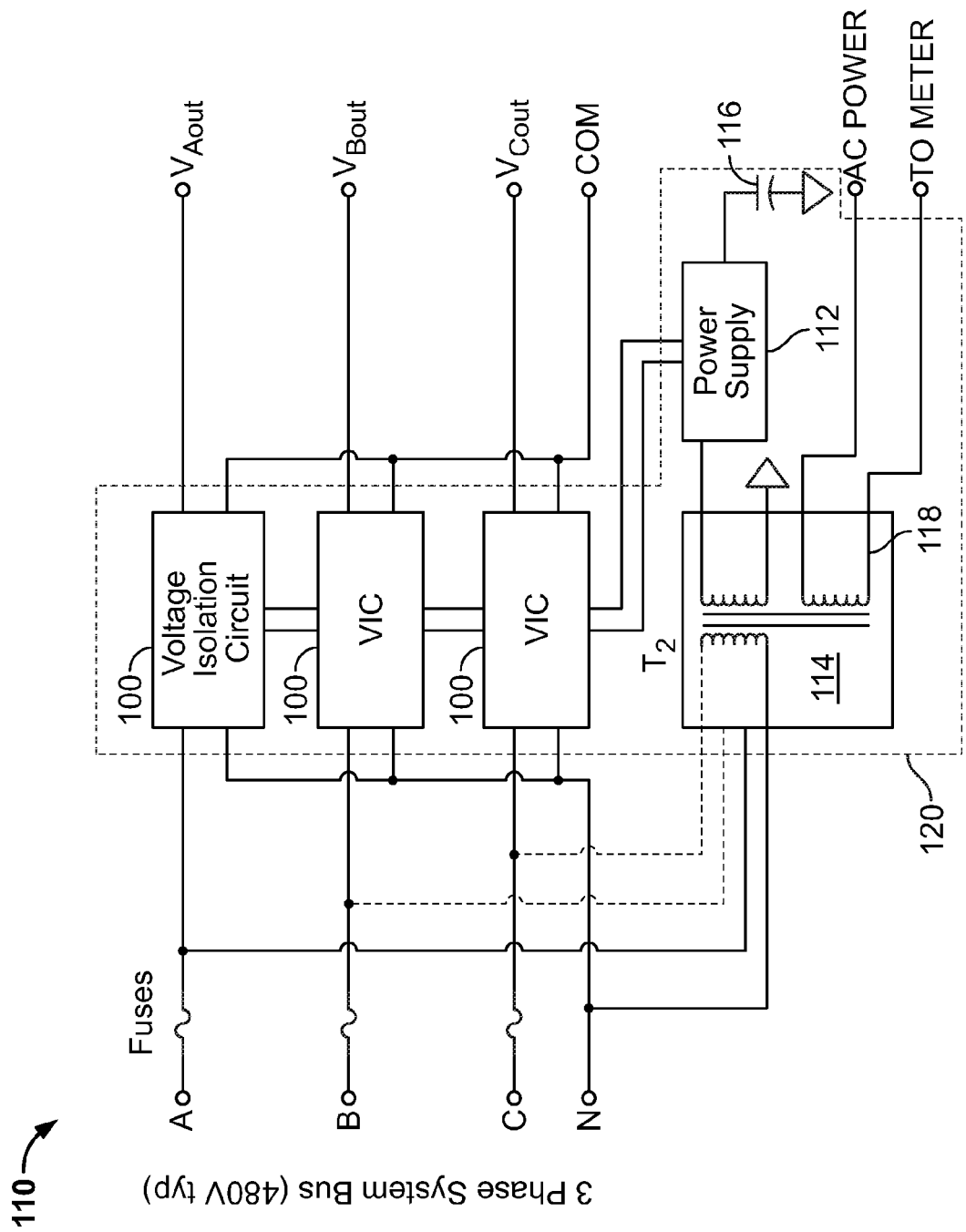
FIG. 2 is a functional block diagram of a three-phase active voltage instrument transformer unit incorporating three voltage isolation circuits as shown in FIG. 1.

FIG. 2 illustrates a functional block diagram of a three-phase active voltage instrument transformer unit 110. The arrangement shown is typical of that used in a low-voltage power distribution system, in this case 480V, 3-phase, Y-connected. Three voltage conditioning circuits 100 (VICs) are shown along with a power supply 112 that includes a control power transformer 114, suitable rectification, filtering, and regulation. Each of the VICs 100 have the identical circuit components shown in FIG. 1, though the individual component values and parameters can vary (e.g., number of windings, values of R1 and R2). In addition, a supercapacitor 116 or electric double-layer capacitor for storing energy to power the unit 110 through power losses of relatively short duration is also shown. The supercapacitor 116 has a capacity on the order of multiple farads. The three output voltages $V_{Aout}$, $V_{Bout}$, and $V_{Cout}$ produced by each of the VICs 100 and common COM can be fed directly into the sensing circuitry of an electric meter (not shown) employing solid-state voltage sensing without the need for further step-down or isolation (via, e.g., transformers) in the meter. An additional winding 118 is shown on transformer T2 for the purposes of powering the electrical meter to which the voltage isolation circuit 100 is attached.

Finally, because of its small size, the VIC 100 lends itself to innovative and smaller packaging arrangements. Where conventional voltage transformer arrangements often require a large separate enclosure, a device housing the VIC 100 can be small enough to be housed in the panel distribution board itself. One particularly appealing configuration is to package the device housing the VIC 100 so that it mates directly with the lugs on a circuit breaker. In a specific aspect, the dimensions of a device housing the circuit 120 shown in FIG. 2 do not exceed 3 inches by 3 inches.

Figure 3:
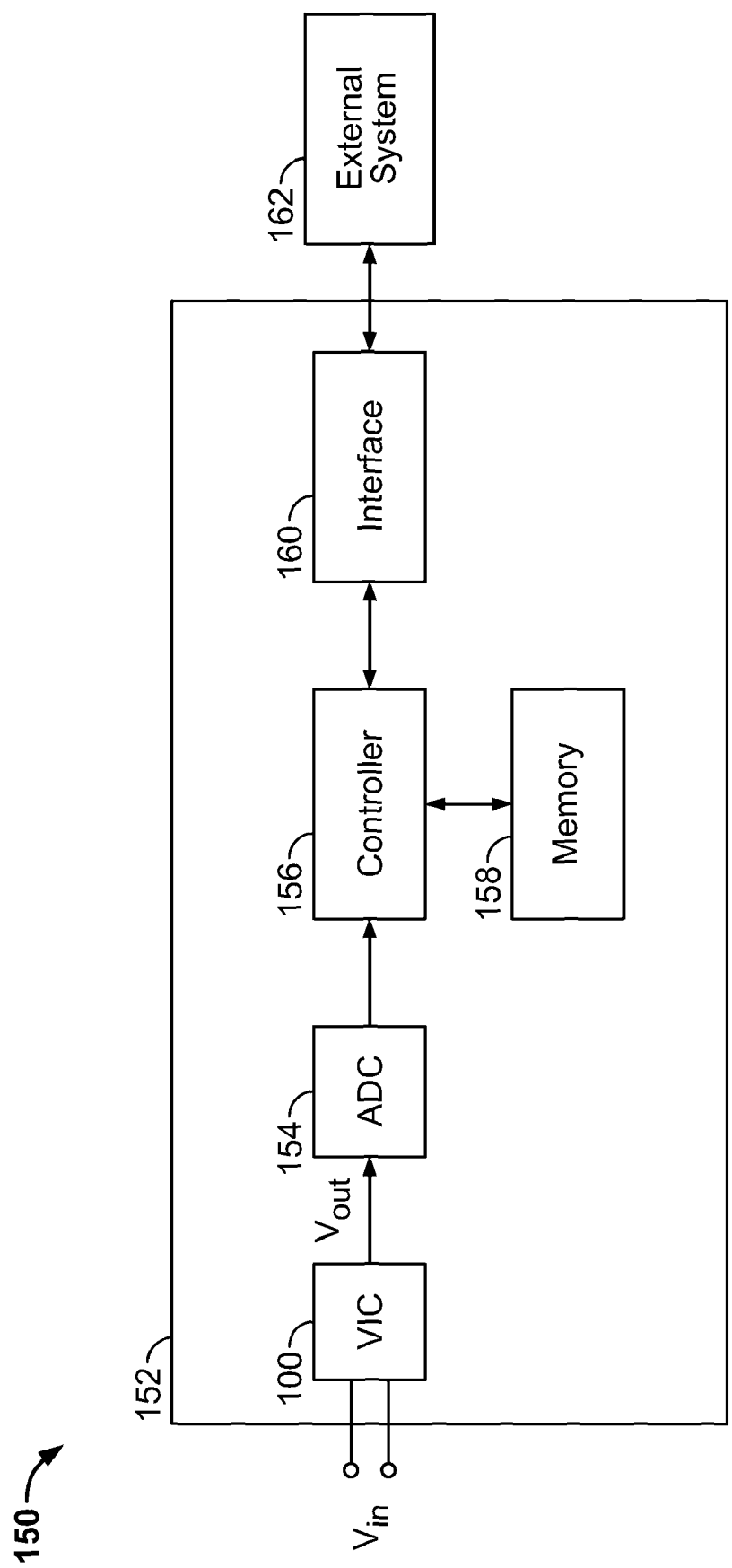
FIG. 3 is a functional block diagram of an intelligent electronic device incorporating the voltage isolation circuit of FIG. 1.

With these smaller packaging arrangements made possible by the invention, the relatively small device housing circuit 120 shown in FIG. 2 allows for incorporation of the transformer arrangements directly into a main IED enclosure. As mentioned above, this space-savings is advantageous for installations where space is limited. In FIG. 3, the monitoring circuitry 100, 154, 156, 160, 158 is incorporated into a housing 152 of an IED 150. IED or monitoring circuitry can include, for example, analog-to-digital converters (ADC) 156, a microprocessor 156, a memory 158, an output circuit or user interface 160 (such as a video display or communications port), and the associated supporting circuitry. The voltage isolation circuit 100 receives an input voltage Vin from the electrical grid (e.g., 120V sinusoidal), and converts it as discussed above into a corresponding scaled analog voltage, Vout. The ADC 156 converts the analog output voltage Vout from the voltage isolation circuit 100 to a corresponding digital representation. The controller 156 produces from the digital representation a value indicative of the output voltage, Vout, and provides that value to an external system 162 (such as a video display or communications port) via the interface 160. Finally, although FIG. 3 shows one VIC 100 for receiving a single-phase voltage input, the housing 152 can include instead the circuit 120 shown in FIG. 2 for receiving a 3-phase voltage input.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A voltage sensing system, comprising:
   a housing having a first voltage isolation circuit coupled to a controller and an interface,
   the first voltage isolation circuit including:
   a current limiting resistor coupled to an input; voltage,
   a current transformer having a primary winding and a secondary winding, wherein the magnitude of current flowing through the primary winding is established by the current limiting resistor, and
   an inverting operational amplifier ("op-amp") connected to the secondary winding, wherein an inverting input of the op-amp is coupled to an output of the op-amp via a gain resistor, and wherein an output voltage at the output of the op-amp is established by the gain resistor, and wherein the ratio of the input voltage to the output voltage is proportional to the ratio between the value of the current limiting resistor and the value of the gain resistor,
   wherein the controller is programmed to produce a value indicative of the output voltage and to provide the value via the interface to an external system.

2. The system of claim 1, wherein a non-inverting input of the op-amp is connected to ground to cause the inverting input to be driven toward a zero potential through the gain resistor such that virtually no current flows into the inverting input and instead flows through the gain resistor to produce the output voltage.

3. The system of claim 1, wherein the input voltage is at least 120V.

4. The system of claim 3, wherein the output voltage is less than 1 volt.

5. The system of claim 1, further comprising:
   a second voltage isolation circuit and a third voltage isolation circuit, wherein the first, second, and third voltage isolation circuits are coupled to first, second, and third phases of a three-phase voltage input, respectively;
   a control power transformer electrically coupled to at least one of the phases and neutral;
   a power supply electrically coupled to a first secondary winding of the control power transformer for supplying power to the respective op-amps of said first, second, and third isolation circuits.

6. The system of claim 5, wherein the control power transformer includes a second secondary winding for providing power to an electrical meter.

7. The system of claim 1, wherein the first voltage isolation circuit is housed within a panel distribution board.

8. The system of claim 1, wherein the first voltage isolation circuit is mated directly to lugs on a circuit breaker.

9. The system of claim 1, wherein the ratio between the primary winding and the secondary winding is fixed.

10. The system of claim 9, wherein the ratio between the primary winding and the secondary winding is one-to-one.

11. The system of claim 1, wherein the input voltage receives current from an electrical grid to which the system is electrically coupled.

12. A voltage sensing system, comprising:
    a first voltage isolation circuit including:
    a current limiting resistor coupled to an input voltage,
    a current transformer having a primary winding and a secondary winding, wherein the magnitude of current flowing through the primary winding is established by the current limiting resistor, and an inverting operational amplifier ("op-amp") connected to the secondary winding, wherein an inverting input of the op-amp is coupled to an output of the op-amp via a gain resistor, and wherein an output voltage at the output of the op-amp is established by the gain resistor, and wherein the ratio of the input voltage to the output voltage is proportional to the ratio between the value of the current limiting resistor and the value of the gain resistor; and a second voltage isolation circuit and a third voltage isolation circuit, wherein the first, second, and third voltage isolation circuits are coupled to first, second, and third phases of a three-phase voltage input, respectively;

a control power transformer electrically coupled to at least one of the phases and neutral; and a power supply electrically coupled to a first secondary winding of the control power transformer for supplying power to the respective op-amps of said first, second, and third isolation circuits.

* * * * *